(12) United States Patent
Baba et al.

(10) Patent No.: US 6,774,409 B2
(45) Date of Patent: Aug. 10, 2004

(54) SEMICONDUCTOR DEVICE WITH NMOS INCLUDING SI:C CHANNEL REGION AND/OR PMOS INCLUDING SIGE CHANNEL REGION

(75) Inventors: Tomoya Baba, Ikoma (JP); Katsumasa Fujii, Yamatokoriyama (JP); Akiyoshi Mutou, Konan (JP)

(73) Assignee: Sharp Kabushiki Kaisha, Osaka (JP)

( * ) Notice: Subject to any disclaimer, the term of this patent is extended or adjusted under 35 U.S.C. 154(b) by 87 days.

(21) Appl. No.: 10/092,729

(22) Filed: Mar. 8, 2002

(65) Prior Publication Data

US 2002/0125502 A1 Sep. 12, 2002

(30) Foreign Application Priority Data

Mar. 8, 2001 (JP) ......................................... 2001-064950

(51) Int. Cl.⁷ ............................................. H01L 21/8234
(52) U.S. Cl. ..................................... 257/189; 257/200
(58) Field of Search .............................. 257/200, 189, 257/190, 63, 69, 201, 20

(56) References Cited

U.S. PATENT DOCUMENTS 6,472,685 B2 * 10/2002 Takagi ......................... 257/77

FOREIGN PATENT DOCUMENTS

| JP | 09-219524 | 8/1997 |
| JP | 10-092952 | 4/1998 |
| JP | 10-093076 | 4/1998 |
| JP | 10-214906 | 8/1998 |
| JP | 10-321733 | 12/1998 |

OTHER PUBLICATIONS

Wesler et al. "Strain Dependence of the Performance Enhancement in Strained–Si $n$–MOSFETs", 1994 IEEE, pp. 15.2.1–15.2.4.
Hargrove et al, "Quantum Mechanical Modeling of the Charge Distribution in a $S_{1-x}$ i/Si, $Ge_x$/Si P–Channel MOSFET", 1994 IEEE, pp. 30.3.1–30.3.4.
Japanese Office Action dated Jan. 20, 2004 (w/o English translation).

* cited by examiner

*Primary Examiner*—Long Pham
*Assistant Examiner*—Hoa B. Trinh
(74) *Attorney, Agent, or Firm*—Nixon & Vanderhye P.C.

(57) ABSTRACT

A semiconductor device comprises: a semiconductor substrate on which a silicon germanium film, a carbon-containing silicon film and a silicon film are formed in this order and a gate electrode on the semiconductor substrate with intervention of a gate oxide film, wherein a channel region of the semiconductor device the is formed in the carbon-containing silicon film or wherein a channel region of the semiconductor device is formed in the silicon germanium film.

16 Claims, 2 Drawing Sheets

SEMICONDUCTOR DEVICE WITH NMOS INCLUDING SI:C CHANNEL REGION AND/OR PMOS INCLUDING SIGE CHANNEL REGION

CROSS-REFERENCE TO RELATED APPLICATION

This application is related to Japanese Patent Application No. 2001-064950 filed on Mar. 8, 2001, whose priority is claimed under 35 USC §119, the disclosure of which is incorporated by reference in its entirety.

BACKGROUND OF THE INVENTION

1. Field of the Invention

The present invention relates to a semiconductor device, more particularly, a semiconductor device having a semiconductor substrate on which a silicon germanium film, a carbon-containing silicon film and a silicon film are formed.

2. Description of Related Art

In recent years, for increasing the operating speed of silicon MOS transistors, techniques of producing high-electron-mobility transistors are now under active development in place of conventional transistors having Si—$SiO_2$ MOS interfaces as channels. In high electron-mobility transistor techniques, hetero interfaces are formed by epitaxially growing, on a Si substrate, films of materials having different lattice constants from the lattice constant of the Si substrate with a view to taking advantage of compression or tensile distortion in a horizontal direction and/or discontinuity in a band structure in the films.

For example, as shown in FIG. 2, IEDM (International Electron Device Meeting), 1994 proposed, on page 373 thereof, a transistor wherein a SiGe film 22 having a Ge concentration gradient of 0% to 20% is formed to have a thickness of 2.1 $\mu$m on a p-type Si substrate 21, a SiGe film 23 having a Ge concentration of 20% is formed to have a thickness of 0.6 $\mu$m on the SiGe film 22, a Si film 24 is epitaxially grown to have a thickness of 13 nm on the SiGe film 23, and as in ordinary MOSs, a $SiO_2$ film 25 to be a gate oxide film and a polysilicon film 26 to be a gate electrode are formed on the Si film 24. In the transistor of this structure, the thick SiGe film 22 having the concentration gradient and the SiGe film 23 having a Ge concentration of 20% are formed to reduce strained distortion, so that distortion is completely reduced on the top surface of the SiGe film 23. By forming the thin Si film 24 on the SiGe film 23, is realized the strained Si film 24. Thereby the effective electron mobility in an N-channel MOS can be improved by about 50% with respect to a non-strained Si film.

For improving the mobility in a pMOS, as shown in FIG. 3, IEDM, 1994 proposed, on page 735 thereof, a transistor wherein a SiGe film 32 having a Ge concentration of 30% and a thickness of 10 nm and a Si film 33 having a thickness of 7 nm are sequentially formed on an n-type Si substrate 31 by epitaxial growth, and further, as in ordinary MOSs, a $SiO_2$ film 34 to be a gate oxide film and a polysilicon film 35 to be a gate electrode are formed on the Si film 33. In the transistor of this structure, the SiGe film 32 having compression distortion therein is formed under the thin Si film 33. By forming a channel in the Si film 33, can be obtained a hole mobility about 1.2 times better than a non-strained Si film.

Further, referring to FIG. 4, Japanese Unexamined Patent Publication No. HEI 10(1998)-321733 proposes, as a technique for forming both an nMOS and a pMOS simultaneously, an nMOS transistor and a pMOS transistor wherein a SiGe film 42 and a Si film 43 are sequentially formed on a Si substrate 41 with an n-well and a p-well formed therein, respectively, and further gate insulating films 44 and gate electrodes 45 are formed thereon. Here, the channel of the nMOS is formed in the strained Si film 43, and the channel of the pMOS is formed in the compressed SiGe film 42.

As shown in FIG. 5, Japanese Unexamined Patent Publication No. HEI 9(1997)-219524 proposes a transistor using a SOI (silicon on insulator) substrate in which a buried oxide film 52 and a SOI film 53 are formed on a Si substrate 51. With regard to this transistor, the SOI film 53 and the buried oxide film 52 are removed from a pMOS region in the SOI substrate, and thereafter a SiGe film 54 having a Ge concentration of 30% and a thickness of 30 nm is epitaxially grown over the resulting SOI substrate and annealed at a high temperature. Thereby distortion is reduced in the SiGe film 54 on the SOI film 53 in the nMOS region. Thereafter a Si film 55 is epitaxially grown to a thickness of about 30 nm, and further a gate insulating film and a gate electrode 57 are formed thereon. Thereby, in the nMOS, the strained Si film 55 on the SOI film 53 is used as a channel, and in the pMOS, the compressed SiGe film 54 on the Si substrate 51 is used as a channel.

Of the above-mentioned transistors, the mobility of the transistor shown in FIG. 2 is improved by forming the SiGe films 22 and 23 having sequentially raised Ge concentrations to reduce the compression distortion on the top face of the SiGe film 23 and also increasing the lattice constant to give a strong strain distortion to the Si film 24 formed thereon. However, this transistor requires the formation of the thick SiGe films 22 and 23, which results in an increase in production costs.

In the CMOS transistor shown in FIG. 4, the nMOS and the pMOS are formed to have the same construction by forming the SiGe films 42 having a Ge concentration of 25 to 50% and a thickness of 5 to 10 nm and forming the Si films 43 thereon. Accordingly, since the SiGe films 42 under the Si films 43 have the compression distortion therein, the electron mobility is not sufficiently improved, especially in the nMOS.

That is, in the CMOS, for improving the electron mobility in the nMOS, the strained Si film 43 is formed on the SiGe film 42 whose distortion is reduced. For this purpose, the thick SiGe film 42 is required to be formed to reduce distortion. However, since the channel of the pMOS and the channel of the nMOS have greatly different structures, it is difficult to produce a CMOS having high effective electron and hole mobilities at the same time.

In the transistor shown in FIG. 5, the SOI substrate is used, and in the nMOS, the thin SiGe film 54 whose distortion is reduced is formed above the buried oxide film 52. However, this transistor requires an SOI substrate, and it has the disadvantage in production since a step is formed between the nMOS and the pMOS due to the removal of the buried oxide film 52 and the SOI layer 53 from the channel region of the pMOS. Also, in the epitaxial growth, the crystallinity is impaired at the step, and therefore, it is difficult to produce a CMOS having high effective electron and hole mobility simultaneously.

SUMMARY OF THE INVENTION

The present invention provides an n-channel semiconductor device comprising a semiconductor substrate on which a silicon germanium film, a carbon-containing silicon film and a silicon film are formed in this order and a gate electrode on the semiconductor substrate with intervention of a gate oxide film, wherein a channel region of the semiconductor device is formed in the carbon-containing silicon film, i.e., wherein the carbon-containing silicon film functions as a channel region.

The present invention also provides a p-channel semiconductor device comprising a semiconductor substrate on which a silicon germanium film, a carbon-containing silicon film and a silicon film are formed in this order and a gate electrode on the semiconductor substrate with intervention of a gate oxide film, wherein a channel region of the semiconductor device is formed in the silicon germanium film, i.e., wherein the silicon germanium film functions as a channel region.

Further, the present invention provides a complementary metal-oxide semiconductor device provided with the above-described n-channel semiconductor device and the above-described p-channel semiconductor device on the same substrate.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The semiconductor device of the present invention is a so-called MOS transistor comprised mainly of a semiconductor substrate, on which a silicon germanium (SiGe) film, a carbon-containing (C-containing) silicon film and a silicon film are formed in this order, and a gate electrode formed on the semiconductor substrate with intervention of a gate oxide film. The present invention is applicable to n-type, p-type and complementary MOS transistors. In the case of a CMOS, MOS transistors are usually formed on the same substrate.

As the semiconductor substrate of the present invention, are usable substrates of element semiconductors such as silicon, germanium and the like, and substrates of compound semiconductors such as GaAs, SiGe and the like, among which a substrate of silicon is preferred. The semiconductor substrate, for example, silicon may be amorphous, polycrystalline or single-crystalline, among which a single crystal silicon semiconductor is preferred. As the semiconductor substrate, a SOI substrate whose surface semiconductor layer is formed of any of the above-mentioned semiconductors may also be used.

In the case where the SiGe film is used in a p-type semiconductor device or a CMOS device, the SiGe film preferably contains about 10 to 40 atom % of germanium and has a thickness of about 5 to 50 nm. In the case where the SiGe film is used in an n-type semiconductor device, the germanium content and the thickness of the film may not be within the above-mentioned ranges. The SiGe film may be formed by a known method, for example, epitaxial growth, CVD method, spattering method and the like, preferably by epitaxial growth.

In the case where the C-containing silicon film is used in the n-type semiconductor device and the CMOS device, the film preferably contains about 0.1 to 1 atom % of carbon and has a thickness of about 5 to 50 nm. In the case where the C-containing silicon film is used in the p-type semiconductor device, the carbon content and the thickness of the film may not be within the above-mentioned ranges. The C-containing film may be formed by a known method, for example, by epitaxial growth using a material containing silicon and carbon, by forming a silicon film by epitaxial growth using a material containing silicon and then doping the silicon film with carbon by solid-phase diffusion, gas-phase diffusion and ion implantation, by CVD method, by spattering method and the like.

The silicon film on the C-containing silicon film may be formed to a thickness of about 5 to 20 nm by epitaxial growth, CVD method, spattering method and the like, preferably by epitaxial growth.

The gate oxide film and, the gate electrode may be formed to ordinary thicknesses by ordinary techniques using materials usually utilized for producing typical MOS transistors.

The semiconductor device of the present invention is now explained in detail with reference to the attached drawings.

Figure 1:
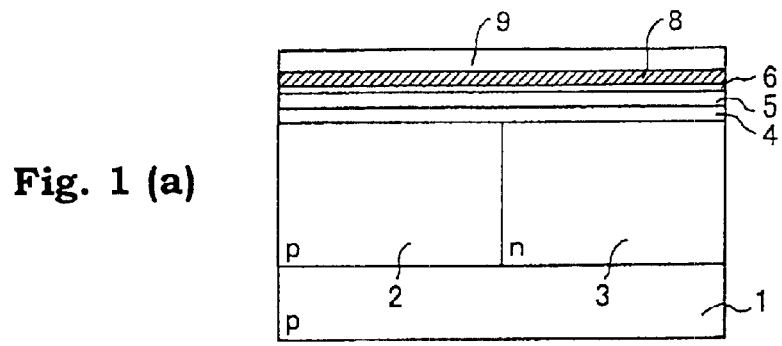
FIGS. 1(a) to 1(d) are schematic sectional views of a major part of a semiconductor device illustrating a production process therefor in accordance with the present invention.
Figure 1:
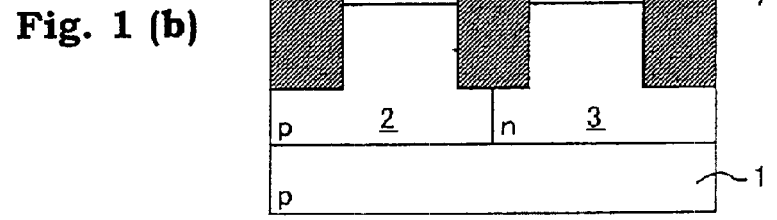
Figure 1:
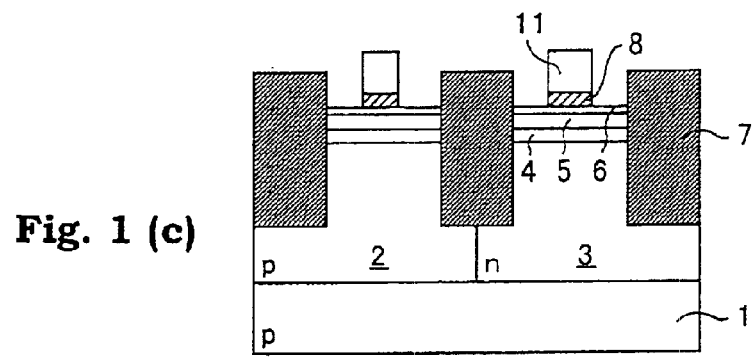
Figure 1:
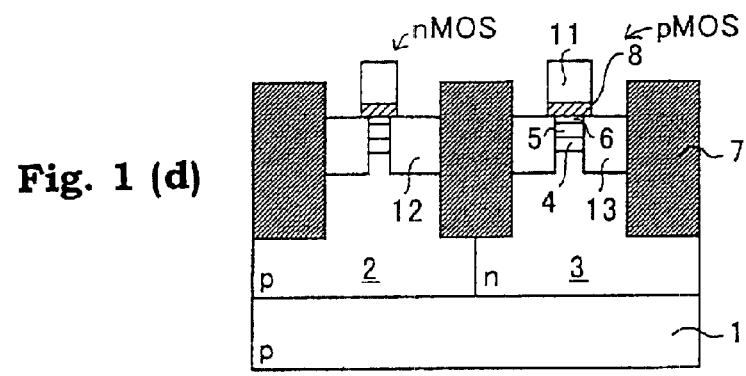
Figure 2:
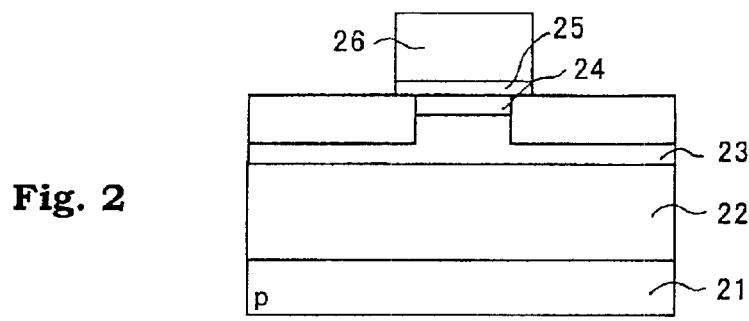
FIG. 2 is a schematic sectional view of a major part of a prior-art nMOS transistor illustrating the construction thereof.
Figure 3:
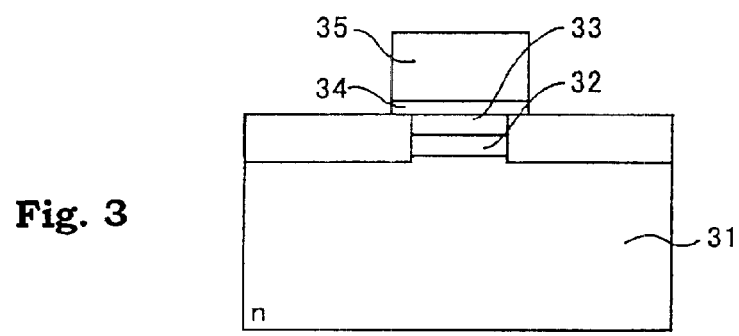
FIG. 3 is a schematic sectional view of a major part of a prior-art pMOS transistor illustrating the construction thereof.
Figure 4:
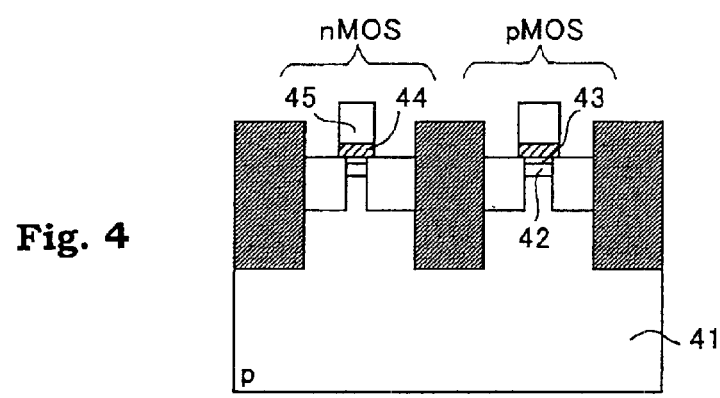
FIG. 4 is a schematic sectional view of a major part of a prior-art CMOS transistor illustrating the construction thereof.
Figure 5:
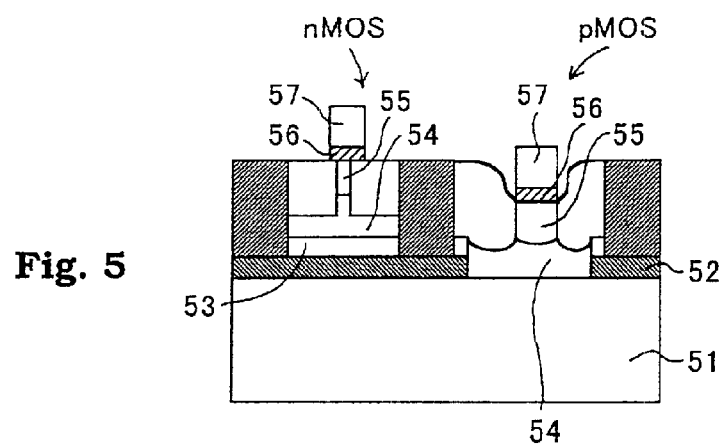
FIG. 5 is a schematic sectional view of a major part of a prior-art CMOS transistor illustrating the construction thereof.

In the semiconductor device of the present invention, as shown in FIG. 1(d), a p-well 2 of about 1 μm depth doped with p-type impurity ions and an n-well 3 of about 1 μm depth doped with n-type impurity ions are formed in a p-type Si substrate 1. The p-well and the n-well are separated from each other by a buried device isolation region 7.

On each of the p-well and the n-well, an epitaxially grown SiGe film 4, an epitaxially grown carbon-containing Si film 5 and an epitaxially grown Si film 6 are formed in this order, and a gate electrode 11 is formed of a polysilicon film thereon with intervention of a gate oxide film 8 of $SiO_2$. Thus an nMOS and a pMOS are formed on the same substrate.

The SiGe film 4 grown on the p-type Si substrate 1 has the same crystal structure as Si of the substrate, but its lattice constant is several % larger than that of Si. Consequently, the SiGe film 4 has compression distortion in the horizontal direction. The C-containing Si film 5 grown thereon has a smaller lattice constant than Si of the substrate, and consequently, has strain distortion in the horizontal direction.

In the nMOS, the electron mobility is improved by forming the channel in the strained C-containing Si film 5, and in the pMOS, the hole mobility is improved by forming the channel in the compressed SiGe film 4. More particularly, the mobility is improved about 50% in the pMOS with a SiGe film 4 having a Ge concentration of 20%. The mobility is improved about 100% with a SiGe film 4 having a thickness of 5 nm (this is the critical thickness that is the minimum thickness the film can have) a Ge concentration of 40%. Thereby the MOS drive current increases approximately twice.

The above-described semiconductor device may be formed as follows.

A p-type Si substrate 1 is used which is doped with boron having a specific resistance of 5 Ω·cm to 20 Ω·cm. In an nMOS region of the Si substrate 1, a p-well 2 is formed by a known ion-implantation technique using a resist mask (not shown) formed by a known photolithography technique. After the resist mask is removed, an n-well 3 is formed in a pMOS region by the same techniques. Ion-implantation conditions at this time may vary depending upon the designing rule for transistors, but for example, with a 0.35 µm rule, the p-well 2 is implanted with boron ions at an implantation energy of 200 keV and a dose of $5 \times 10^{12}$ cm$^{-2}$ and 100 keV and $2 \times 10^{12}$ cm$^{-2}$, and the n-well 3 is implanted with phosphorus ions at an implantation energy of 400 keV and a dose of $5 \times 10^{12}$ cm$^{-2}$ and 200 keV and $2 \times 10^{12}$ cm$^{-2}$.

Subsequently, the resulting substrate 1 is annealed for activation in a diffusion oven at about 750° C. for about an hour. Thereafter, a naturally formed SiO$_2$ film (not shown) is removed with a diluted HF solution. A SiGe film 4 is hetero-epitaxially grown over the substrate 1 to have a Ge concentration of 10% to 40% and a thickness of 5 nm to 50 nm by a known epitaxial growth technique using a mixture gas of SiH$_4$ and GeH$_4$. At this time, the higher the Ge concentration is, the larger the compression distortion can be obtained in the SiGe film, but in such a case, the critical thickness which is the maximum thickness for avoiding the occurrence of crystal defects decreases. The Ge concentration and the film thickness are set in consideration of this relationship. For example, if the Ge concentration is 40%, the film thickness is set to 10 nm or below.

Thereafter, the epitaxial growth gas in an apparatus is replaced with a mixture gas of SiH$_4$ and Si(CH$_3$)H$_3$ to epitaxially grow a carbon-containing Si film 5 having a carbon concentration of 0.1% to 2% and a thickness of 10 nm to 50 nm.

In the same apparatus, the pitaxial growth gas is replaced with a SiH$_4$ gas to epitaxially grow a Si film 6 having a thickness of 5 nm to 20 nm. Here, the maximum thickness of the Si film 6 is fixed because the channel of the nMOS is produced in the C-containing Si film 5, but the thickness thereof may be adjusted as appropriate in consideration of the thickness of the gate insulator 8, the dopant concentration in the Si film 6, the offset value of zone energy between the C-containing Si film 5 and the Si film 6. For example, if the gate insulator 8 is 2.5 nm thick, the carbon concentration is 0.5% and the dopant concentration is $3 \times 10^{17}$ cm$^{31}$, the Si film 6 may preferably be about 2 nm to 6.5 nm thick in consideration of reduction in the thickness of the film at gate oxidation.

Next, the gate oxide film 8 is formed using a known rapid thermal oxidation (RTO) method. Thereafter, a polysilicon film 9 is formed to about 100 nm thickness by a known CVD method using a SiH$^4$ gas at 550° C. (FIG. 1(a)).

Subsequently, using a resist mask (not shown) formed by a known photolithography technique, a trench of 300 nm to 500 nm depth is formed in a device isolation region including the polysilicon film 9 and the gate oxide film 8 by a known reactive ion etching (RIE) method using a SF$_6$ gas. The trench is buried with SiO$_2$ by a known CVD method using a SiH$_4$ and O$_2$ gas. The SiO$_2$ film is removed for flattening from regions other than the device isolation region by a known chemical mechanical polishing (CMP) method.

In this case, it is preferable to use an abrasive having a larger selective ratio to SiO$_2$ than to polysilicon in order that the CMP stops at the surface of the polysilicon film 9. As examples of such abrasives, may be mentioned silica (SiO$_2$), ceria (CeO$_2$), zirconia (ZrO$_2$), alumina (AlO$_3$) and the like. Especially, if a ceria slurry is used, a selective ratio of 500 or more can be obtained. A polysilicon film 10 is formed on the resulting substrate 1 by a known CVD method, and the surface thereof is flattened as shown in FIG. 1(b).

Thereafter, as shown in FIG. 1(c), the polysilicon film 10 and the polysilicon film 9 are made into a gate electrode 11 by a known RIE method using a SF$_6$ gas with use of a resist mask (not shown) formed by a known photolithography technique.

Subsequently, as shown in FIG. 1(d), a resist mask (not shown) is formed to cover regions other than the nMOS region by a known photolithography technique, and using this resist mask, arsenic ions are implanted at an implantation energy of 40 keV and a dose of $3 \times 10^{15}$ cm$^{-2}$ by a known ion-implantation method so as to form source/drain regions 12 of N+diffusion layers in self-alignment on both sides of the gate electrode 11. Likewise, a resist mask (not shown) is formed to cover regions other than the pMOS region by a known photolithography technique, and using this resist mask, BF$_2$ ions are implanted at an implantation energy of 40 keV and a dose of $3 \times 10^{15}$ cm$^{-2}$ by a known ion-implantation method so as to form source/drain regions 13 of P$^+$ diffusion layers in the pMOS transistor.

Thereafter, using known techniques, an interlayer insulating film is formed for insulation from an upper wiring layer, a hole is formed for connection with the upper wiring layer, and the upper wiring layer is formed. Thus a CMOS (complimentary MOS) is completed, which can be used for an LSI integrated circuit.

According to the present invention, in an semiconductor device having a gate electrode on a semiconductor substrate with intervention of a gate oxide film, the semiconductor substrate having a SiGe film, a C-containing silicon film and a silicon film which are formed thereon in this order, the electron mobility can be improved since the C-containing silicon film functions as a channel region. In other words, the electron mobility increases as the crystals in hetero epitaxial films have a greater difference in their lattice constants and the strain distortion is larger. Accordingly, utilizing difference in lattice constants having the relationship of SiGe>Si>SiC, the strain distortion can be increased with the structure of a silicon film/a C-containing silicon film/a SiGe film/a semiconductor substrate. Thereby, it is possible to improve the electron mobility in an n-type semiconductor device and to realize a high-frequency LSI, the operating speed of which has been unable to be increased only with bipolar transistors so far. Moreover, with the above-described construction, a thick SiGe film for reducing the compression distortion becomes unnecessary, which can reduce production costs greatly.

Also, according to the present invention, in an semiconductor device having a gate electrode on a semiconductor substrate with intervention of a gate oxide film, the semiconductor substrate having a SiGe film, a C-containing silicon film and a silicon film which are formed thereon in this order, the hole mobility can be improved because the SiGe film functions as a channel region. In other words, the hole mobility increases as the crystals in hetero epitaxial films have a greater difference in their lattice constants and the compression distortion is larger. Accordingly, utilizing difference in lattice constants having the relationship of SiGe>Si>SiC, the compression distortion can be increased with the structure of a silicon film/a C-containing silicon film/a SiGe film/a semiconductor substrate. Thereby, it is possible to improved the hole mobility in a p-type semiconductor device and to obtain a high-speed semiconductor device.

Particularly, in the case where the SiGe film contains 10 atom % to 40 atom % of Ge and has a thickness of 5 nm to 50 nm and in the case where the C-containing silicon film contains 0.1 atom % to 1 atom % of carbon and has a thickness of 5 nm to 50 nm, a sufficient distortion can be obtained in the n-type semiconductor device and a sufficient compression distortion can be obtained in the p-type semiconductor device. Thus the electron and hole mobility can be improved as much as possible. Also the Ge and C contents can be ensured by controlling the formation of the SiGe film and the C-containing film.

Further, in the case where the semiconductor substrate is a single crystal silicon substrate, the SiGe film and the C-containing silicon film formed thereon can be obtained as single crystal films, which can improve the electron and hole mobility.

Furthermore, in the case where the semiconductor substrate is an SOI substrate, the parasitic capacity between the source and the drain of the semiconductor device can be reduced and a higher-speed operation can be realized.

Also, in the case where the above-described n-type and p-type semiconductor devices are formed on the same semiconductor substrate, the channel regions can be formed by the strained C-containing Si film and by the compressed SiGe film with regard to electrons and holes, respectively. Thus, a complementary semiconductor device can be formed of the n-type and p-type semiconductor devices of the same construction. Therefore, it is possible to provide a semiconductor device of simple structure whose electron and hole mobility can be improved about twice as compared with prior-art semiconductor devices, without giving rise to problems such as occurrence of steps and the like, which have been problems with the prior-art semiconductor devices. Also, by improving the electron mobility in the n-type semiconductor, it is possible to produce a high-frequency LSI with a complementary semiconductor device, for example, with a CMOS and to reduce production costs greatly. The operating speed of the high-frequency LSI has been unable to be increased only with bipolar transistors so far.

What is claimed is:

1. A semiconductor device including each of n-channel and p-channel devices on a common substrate, the semiconductor device comprising:
   each of the n-channel and p-channel devices including a semiconductor substrate on which a silicon germanium film, a carbon-containing silicon film and a silicon film are formed in this order, and
   a gate electrode on the semiconductor substrate with intervention of a gate oxide film,
   wherein a channel region of the n-channel device is different than a channel region of the p-channel device in that the channel region of the n-channel device is formed mainly in the carbon-containing silicon film, and the channel region of the p-channel device is formed mainly in the silicon germanium film.

2. A p-channel semiconductor device comprising:
   a semiconductor substrate on which a silicon germanium film, a carbon-containing silicon film and a silicon film are formed in this order, and
   a gate electrode on the semiconductor substrate with intervention of a gate oxide film,
   wherein a channel region of the p-channel semiconductor device is formed in the silicon germanium film.

3. A semiconductor device according to claim 1 or 2, wherein the silicon germanium film contains 10 atom % to 40 atom % of germanium and has a thickness of 5 nm to 50 nm.

4. A semiconductor device according to claim 1 or 2, wherein the carbon-containing silicon film contains 0.1 atom % to 1 atom % of carbon and has a thickness of 5 nm to 50 nm.

5. A semiconductor device according to claim 1 or 2, wherein the semiconductor substrate is a single crystal silicon substrate.

6. A semiconductor device according to claim 1 or 2, wherein the semiconductor substrate is an SOI substrate.

7. The semiconductor device of claim 1, wherein the carbon-containing silicon film consists essentially of silicon and carbon.

8. The semiconductor device of claim 2, wherein the carbon-containing silicon film consists essentially of silicon and carbon.

9. The semiconductor device of claim 1, wherein the silicon germanium film consists essentially of silicon and germanium.

10. The semiconductor device of claim 2, wherein the silicon germanium film consists essentially of silicon and germanium.

11. The semiconductor device of claim 1, wherein the p-channel device comprises a pMOS transistor, and the n-channel device comprises an nMOS transistor.

12. The semiconductor device of claim 1, wherein the silicon germanium film is located directly on and contacting the semiconductor substrate.

13. An n-channel semiconductor device comprising:
   a semiconductor substrate on which (a) a film consisting essentially of silicon and germanium, (b) a film consisting essentially of carbon and silicon, and (c) a film consisting essentially of silicon formed in this order,
   a gate electrode on the semiconductor substrate, and
   wherein a channel region of the n-channel semiconductor device is mainly in the film consisting essentially of carbon and silicon.

14. The semiconductor device of claim 1, wherein a lattice constant of the carbon-containing silicon film is less than respective lattice constants of the silicon germanium film and the silicon film, and wherein the lattice constant of the silicon film is less than the lattice constant of the silicon germanium film.

15. The semiconductor device of claim 2, wherein a lattice constant of the carbon-containing silicon film is less than respective lattice constants of the silicon germanium film and the silicon film, and wherein the lattice constant of the silicon film is less than the lattice constant of the silicon germanium film.

16. An n-channel semiconductor device comprising:
   a semiconductor substrate on which a silicon germanium film, a carbon-containing silicon film and a silicon film are formed in this order,
   a gate electrode on the semiconductor substrate,
   wherein a channel region f the n-channel semiconductor device is mainly formed in the carbon-containing silicon film, and
   wherein a lattice constant f the carbon-containing silicon film is less than respective lattice constants of the silicon germanium film and the silicon film, and wherein the lattice constant of the silicon film is less than the lattice constant of the silicon germanium film.

* * * * *